United States Patent
Vagher

(10) Patent No.: US 6,362,685 B1
(45) Date of Patent: Mar. 26, 2002

(54) POWER AMPLIFIER WITH MULTILEVEL POWER MODES

(75) Inventor: Michael R. Vagher, Vinton, IA (US)

(73) Assignee: Rockwell Collins, Inc., Cedar Rapids, IA (US)

( * ) Notice: Subject to any disclaimer, the term of this patent is extended or adjusted under 35 U.S.C. 154(b) by 0 days.

(21) Appl. No.: 09/619,814

(22) Filed: Jul. 20, 2000

(51) Int. Cl.[7] .............................................. H03F 3/68
(52) U.S. Cl. ..................... 330/124 R; 330/51; 330/53; 330/129; 330/151
(58) Field of Search ...................... 330/51, 53, 124 R, 330/129, 151

(56) References Cited

U.S. PATENT DOCUMENTS 4,598,252 A * 7/1986 Andricos ..................... 330/51

* cited by examiner

Primary Examiner—Michael B Shingleton
(74) Attorney, Agent, or Firm—Nathan O. Jensen; Kyle Eppele

(57) ABSTRACT

A multilevel power amplifier using hybrid couplers is disclosed. A splitter network is connected to an input amplifier stage that amplifies and modulates the input signal with the outputs of the splitter network connected to switches for selecting desired splitter output signals. The desired splitter output signals are amplified by power amplifier stages connected to the switches. A bypass network is connected to the splitter network and an output combiner network to bypass the power amplifier stages. The output combiner network is connected to the power amplifier stages and to the bypass network to combine the bypass signals and the amplified signals into a desired power output signal. Two or four power amplifier stages may be used to deliver power at low, medium, and high power levels.

11 Claims, 15 Drawing Sheets

POWER AMPLIFIER WITH MULTILEVEL POWER MODES

BACKGROUND OF THE INVENTION

This invention relates to radio communications and more specifically to multilevel power amplifiers used in radio frequency (RF) communications transmitting equipment.

RF power amplifiers are used in military and commercial applications to increase transmitted power levels to meet communications systems requirements. Many applications require multiple power levels due to differing transmit range requirements. Some applications require a RF power amplifier to operate at three power levels such as high, medium, and low.

Present approaches of obtaining multiple power levels from a power amplifier involve switching the signal path around the high power stages. These approaches require the use of high power RF switches typically implemented with PIN diodes and quarter wave lines. These high power RF switches are costly, have poor reliability, and reduce the efficiency of the RF power amplifier. Another disadvantage of using high power PIN diode RF switches is that a modulated amplifier at the input of the power amplifier sees impedance changes on its output in the different power modes. The modulated amplifier transmits into either a splitter network or a bypass path and since the design of the modulated amplifier is dependant on the output load, there is a comprise in the design to satisfy all load situations.

What is needed is a power amplifier capable of delivery multiple power levels at low cost, with good efficiency, and with good modulation performance and spectral quality.

SUMMARY OF THE INVENTION

A power amplifier with multiple power modes for providing a desired output power level is disclosed. The power amplifier has an input amplifier stage for amplifying an input signal. A splitter network is connected to the input amplifier stage for splitting the amplified input signal into splitter output signals. Switches connected to the splitter network select desired splitter output signals. Power amplifier stages connected to the switches amplifying the desired splitter output signals into amplified output signals. A bypass network provides a bypass path around the power amplifier stages. A combiner network connected to the power amplifier stages and to the bypass network combines the amplified output signals and the bypass signal to obtain the desired power output level. The splitters and combiners are 3-dB hybrids.

The power amplifier splitter network further comprises an input splitter for splitting the input signal. The input splitter has an input port connected to the input amplifier for receiving the amplified input signal and an isolation port connected to a termination. A first splitter in the splitter network provides splitter output signals and has an input port connected to a 90-degree port of the input splitter and an isolation port connected to a termination. A second splitter also provides splitter output signals and has an input port connected to a 0-degree port of the input splitter and an isolation port connected to the bypass network.

The switches in the power amplifier further comprise a first switch connected to a 90-degree port of the first splitter for selecting the desired splitter output signals. A second switch is connected to a 0-degree port of the first splitter for selecting the desired splitter output signals. A third switch is connected to a 0-degree port of the second splitter for selecting the desired splitter output signals. A fourth switch is connected to a 90-port of the second splitter for selecting the desired splitter output signals.

The power amplifier stages comprise four power amplifier stages. A first power amplifier stage is connected to the first switch for amplifying the desired splitter output signals into the amplified output signals. A second power amplifier stage is connected to the second switch for amplifying the desired splitter output signals into the amplified output signals. A third power amplifier stage is connected to the third switch for amplifying the desired splitter output signals into the amplified output signals. A fourth power amplifier stage is connected to the fourth switch for amplifying the desired splitter output signals into the amplified output signals.

The bypass network may be a hybrid coupler directional switch. The hybrid directional switch comprises a third splitter with an isolation port connected to a termination and an input port connected to an isolation port of the second splitter to receive and split the bypass signal. A first switch is connected to a 0-degree output port of the third splitter for switching the split bypass signal. A second switch is. connected to a 90-degree output port of the third splitter for switching the split bypass signal. A third combiner has an input port connected to an output of the first switch for receiving the split bypass signal, an isolation port connected to an output of the second switch for receiving the split bypass signal, a 0-degree output connected to a termination, and a 90-degree output port for outputting the combined bypass signal.

The power amplifier combiner network further comprises a first combiner with an input port connected to the first power amplifier stage, an isolation port connected to the second power amplifier stage, and a 90-degree port connected to a termination. The first combiner combines the amplified output signals. A second combiner has with an input port connected to the third power amplifier stage, an isolation port connected to the fourth power amplifier stage, and a 0-degree port connected to a termination. The second combiner combines the amplified output signals. An output combiner has with an input connected to a 0-degree port of the first combiner, an isolation port connected to a 90-degree port of the second combiner, and a 0-degree port connected to a termination. The output combiner further combines the amplified output signals. A coupler with an input port connected to a 90-degree port of the output combiner receives the combined amplified output signals, a coupled port connected to the 90-degree port of the third combiner receives the bypass signal, and an output port provides the desired power output level.

Another embodiment of the power amplifier may comprise two power amplifier stages. A first power amplifier combiner combines the desired splitter output signals. The first power amplifier combiner has an input port connected to the first switch, an isolation port connected to the second switch, and a 90-degree port connected to a termination. A second power amplifier combiner combines the desired splitter output signals. The second power amplifier combiner has an input port connected to the third switch, an isolation port connected to the fourth switch, and a 0-degree port connected to a termination. A first power amplifier stage amplifies the first power amplifier combiner output and is connected to a 0-degree port of the first power amplifier combiner. A second power amplifier stage amplifies the second power amplifier combiner output and is connected to a 90-degree port of the second power amplifier combiner.

The bypass network of the power amplifier with two power amplifier stages also may be a hybrid coupler directional switch. A third splitter receives the bypass signal and splits it. A pair of switches connected to the third splitter outputs switch the bypass signal. A third combiner connected to the pair of switches recombines the bypass signal and outputs the bypass signal.

The two-stage power amplifier combiner network comprises an output combiner with an input connected to the first power amplifier stage, an isolation port connected to the second power amplifier stage, and a 90-degree port connected to a termination. The output combiner combines the amplified output signals. A coupler with an input port connected to a 0-degree port of the output combiner receives the combined amplified output signals, a coupled port connected to a 90-degree port of the third combiner for receives the bypass signal, and an output port provides the desired power output level.

It is an object the present invention to provide a power amplifier capable of delivery multiple power levels at low cost, with good efficiency, and with good modulation performance and spectral quality.

It is an advantage of the present invention to eliminate the need for high power RF switches.

It is an advantage of the present invention to provide a multilevel power amplifier with a bypass path with high isolation from the main path.

It is an advantage of the present invention that no bypass path is used in a medium power mode.

It is a feature of the present invention to provide a multilevel power amplifier with a modulated stage that transmits into the same load for each power level.

BRIEF DESCRIPTION OF THE DRAWINGS

The invention may be more fully understood by reading the following description of the preferred embodiments of the invention in conjunction with the appended drawings wherein.

DETAILED DESCRIPTION

Power amplifiers are required to have multiple operating power levels in many applications. In a typical avionics application there may be a requirement for three power levels such as high, medium, and low in order to adjust for operating range. With each of these power levels, the performance and spectral quality of the amplifier must be maintained.

Figure 1:
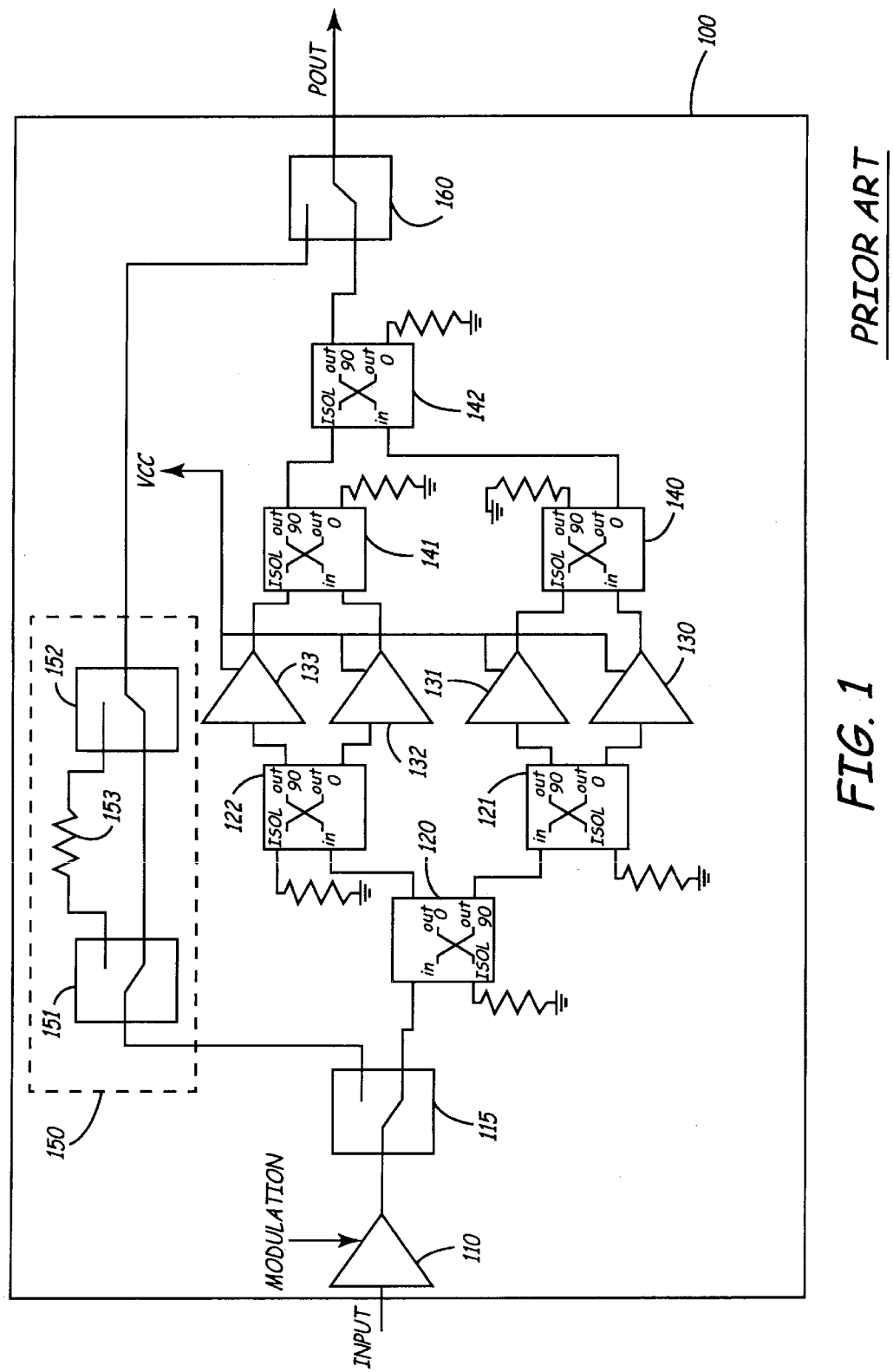
FIG. 1 is a block diagram of a prior art multilevel power amplifier.

An example of a current power amplifier to achieve multiple power levels is shown in FIG. 1. In the typical power amplifier 100 of FIG. 1, high, medium, low power levels are achieved by switching a signal path around the high power stages. In the example of FIG. 1, four power amplifier stages (130, 131,132, and 133) are combined to create the desired power level for transmission. The four power amplifier stages (130, 131,132, and 133) are driven by a single input power amplifier stage 110 that is modulated to create the desired waveform for a particular signal. The single modulated input amplifier stage 110 is connected to a single pole double throw (SPDT) input switch 115. One output of the switch 115 feeds a splitting network consisting of three equal power splitters (120, 121, and 122) that creates the drive for the four power amplifier stages (130, 131, 132, and 133). The outputs of the four power amplifier stages (130, 131, 13:2, and 133) are combined in a combining network consisting of three combiners (140, 141, and 142). The output of the combining network is fed to an input of a second SPDT switch 160 and then out from the switch 160 to form the amplifier 100 output. A second output of the input switch 115 is connected to a bypass path 150 around the four power amplifier stages (130,131,132, and 133) to a second input of the second switch 160. When switches 115 and 160 are connected to the four power amplifiers (130, 131, 132, and 133), the bypass path 150 is isolated and the amplifier 100 is transmitting at the highest power level.

To obtain a medium power level in the amplifier 100 of FIG. 1, the input switch 115 diverts the output power from input amplifier 110 around the high power amplifiers (130, 131,132, and 133) through the bypass path 150. In the bypass path 150, a SPDT switch 151 receives the output from input amplifier 110. One output of switch 151 is connected to a direct path through the bypass path 150 to an input of SPDT switch 152. The output of switch 152 is connected to a second input of output switch 160 to complete the bypass around the power amplifiers (130, 131, 132, and 133). At the medium power level, no RF power is sent to the four power amplifiers (130, 131, 132, and 133), they are isolated by the two switches 115 and 160, and they are quiescent.

In order to obtain the low power level the bypass path 150 is again used but in this case, the signal is diverted to a selectable attenuator 153 to reduce the power to the desired lowest power level. The two SPDT switches (151 and 152) are used in the bypass path 150 to select either an non-attenuated medium power path or a low power path with the selectable attenuator 153 in the path.

The switching in the amplifier 100 is achieved with high power SPDT RF switches. This requirement for high power switching limits implementation of these switches to PIN diode-based switching and quarter-wave lines to reflect the signal to either path as is known in the art. One disadvantage of this approach is that high power switches are costly and reduce efficiency of the power amplifier 100. Another disadvantage is the change in impedance that the modulated input amplifier 110 sees on its output in the different power modes. The modulated input amplifier 110 transmits into either the splitter network (120, 121, and 122) or the bypass path 150. Since the design of such amplifiers is dependent on the output load, there must be a compromise in the design to satisfy both load situations.

Figure 2:
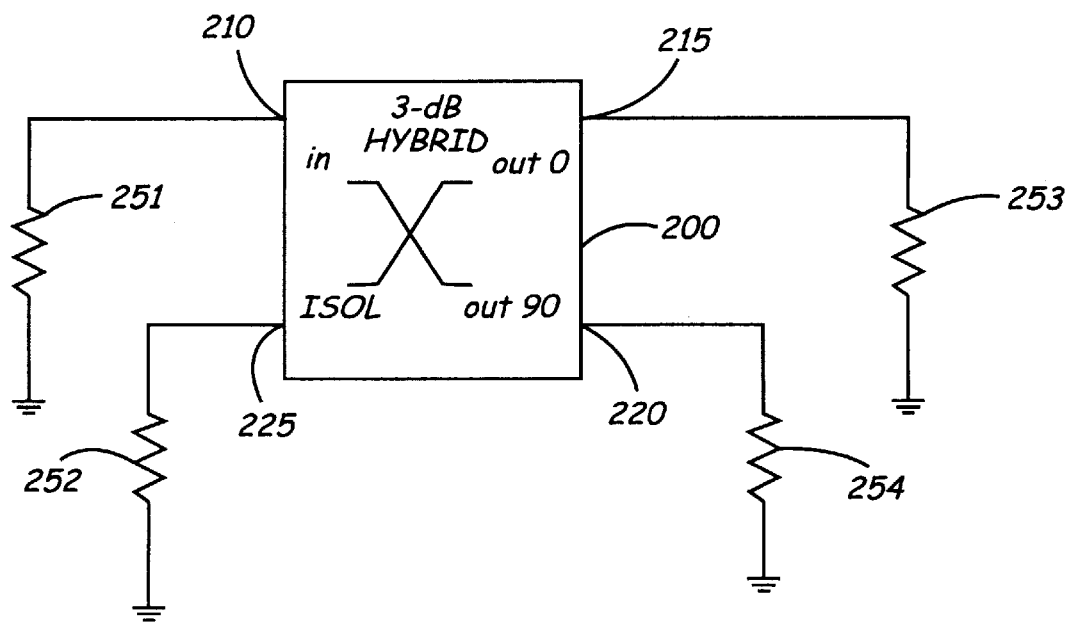
FIG. 2 is a block diagram of a 3-dB hybrid coupler as used in the present invention.
Figure 3:
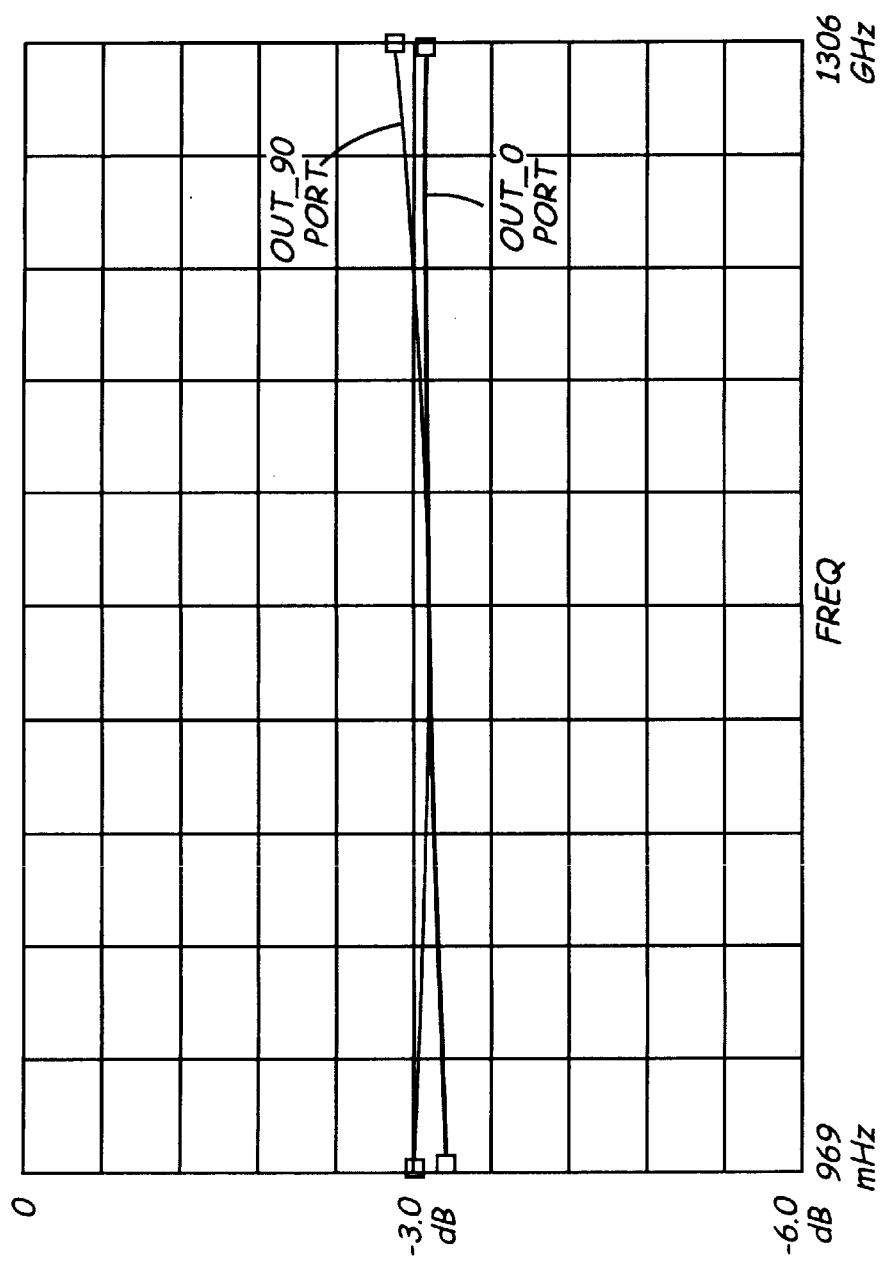
FIG. 3 is a graph showing operation of the 3-dB hybrid coupler of FIG. 2.

An important element used in the design of a multilevel power amplifier of the present invention is referred to as a 3-dB hybrid as known in the art. The 3-dB hybrid 200, shown in FIG. 2, is a passive four-port coupler with specific characteristics that are used to advantage in the present invention as will be discussed later. The 3-dB hybrid 200 is also referred to as a splitter or a combiner depending on its application. The 3-dB hybrid 200 has four ports: IN (210), $OUT_{13}$ 0 (215), OUT_90 (220), and ISOLATED (225) ports. If a signal is impressed upon the input or IN port 210, it is split and half the power is sent to the OUT_0 port 215 and half is sent to the OUT_90 port 220. The power available at these ports is reduced by 3 dB and hence the name. In addition, the phase of the signals at these ports differs by 90 degrees and the phase is designated by the 0 or 90 suffix:. The OUT_0 port is a 0-degree output port and the OUT_90 is a 90-degree output port. The ISOLATED port 225 ideally will source no power since the signal is cancelled at this port. One physical implementation of the hybrid 200 is a coupled pair of stripline transmission lines that are one-quarter wavelength long at the frequency of operation. The diagram in FIG. 2 has 50-ohm termination/simulation ports (251, 252, 253, and 254) on all four ports of the hybrid 200. FIG. 3 shows an S-parameter simulation of the hybrid 200 when power is input to the IN port 210. The X-axis is frequency while the Y-axis is power in dB relative to the input power. As seen, the two outputs are 3-dB down from the input power. In an actual implementation, the ISOLATED port 225 will have power output about 30-dB down from the input power and can be considered isolated compared to the primary outputs.

Figure 4:
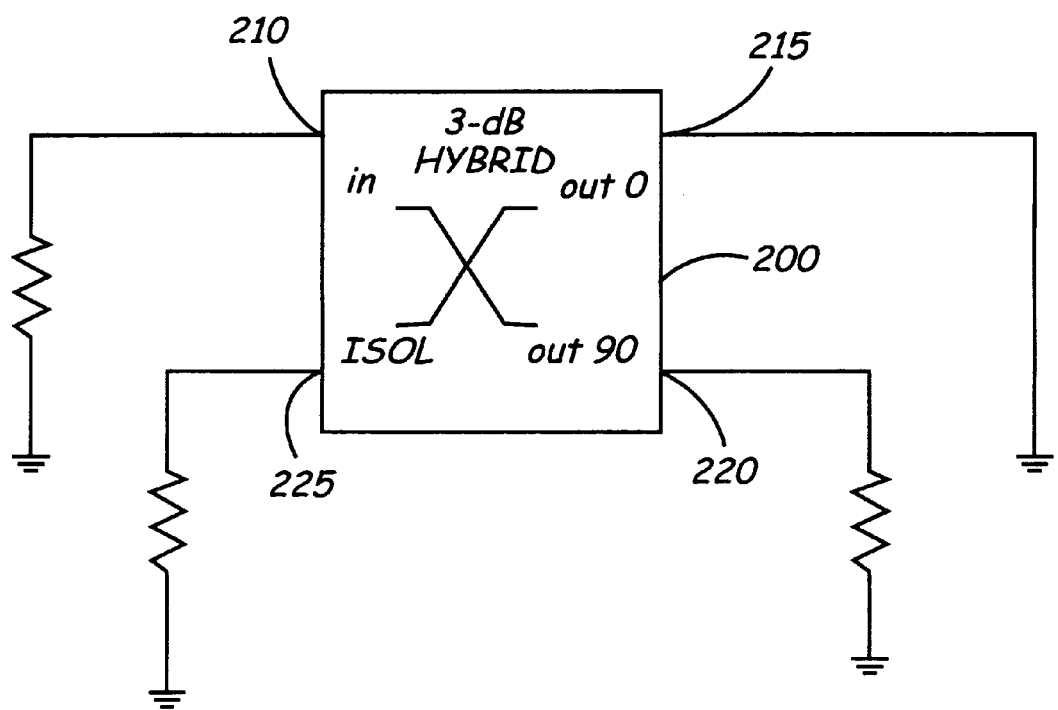
FIG. 4 is a block diagram showing operation of the 3-dB hybrid coupler of FIG. 2 in a shorted output condition.
Figure 5:
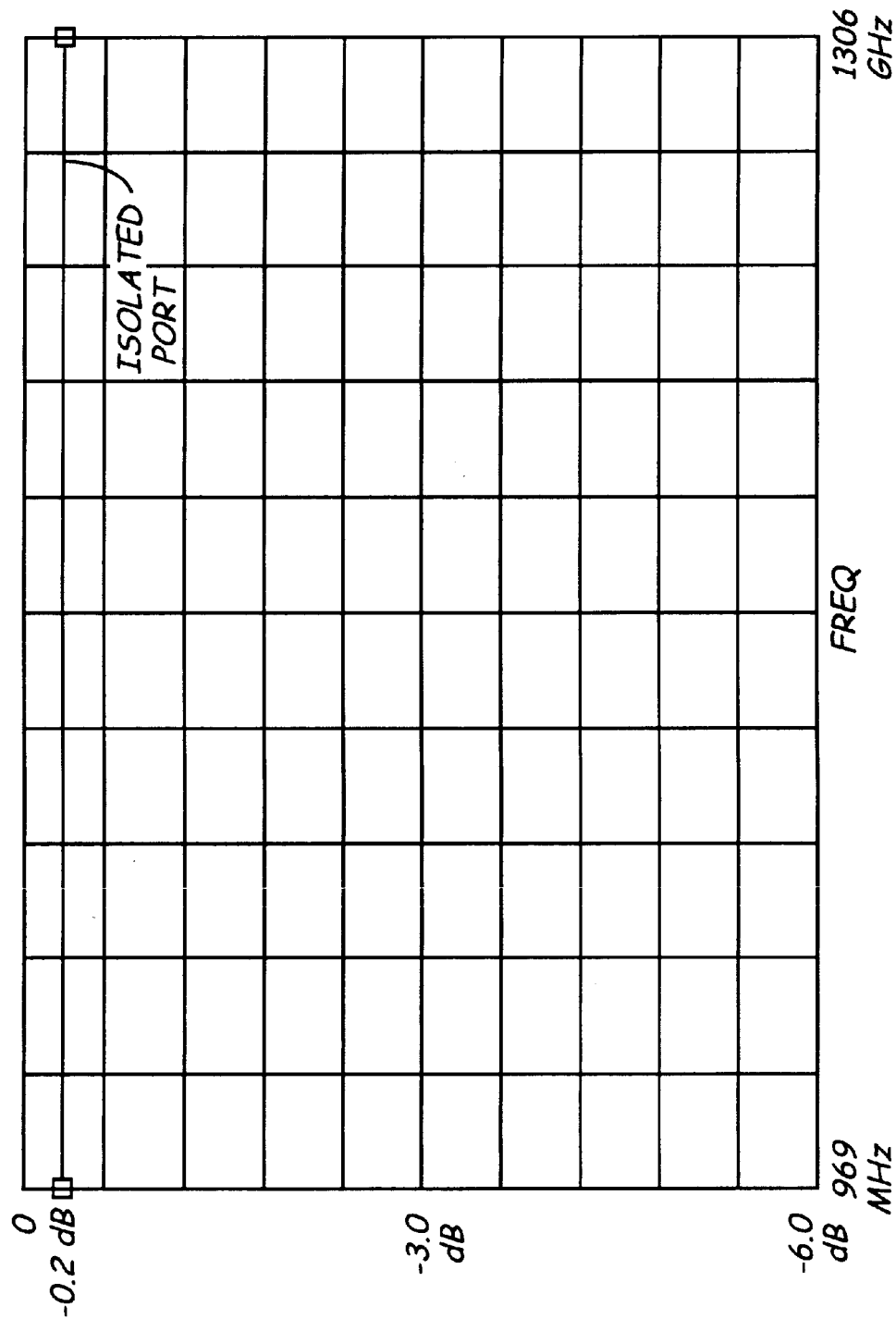
FIG. 5 is a graph showing operation of the hybrid coupler of FIG. 2 in a shorted condition.

Another property of the hybrid 200 that is important to the power amplifier implementation of the present invention is illustrated in FIG. 4. In FIG. 4, the two outputs OUT_0 215 and OUT_90 220 are shorted to ground and the IN 210 and ISOLATED ports 225 are analyzed. In this case, power is input to the IN port 210, split and sent out the OUT_0 port 215 and OUT_90 port 220 but since they are shorted the incident power is reflected back to these same ports. A phasing analysis shows that this reflected power is then combined in the ISOLATED port 225 and cancelled in the IN port 210. Therefore, the power is not reflected back to the IN port 210 but rather to the ISOLATED port 225. This can then in essence act as a switch to transfer power back into the ISOLATED port 225. The response of a shorted hybrid is shown in FIG. 5.

Figure 6:
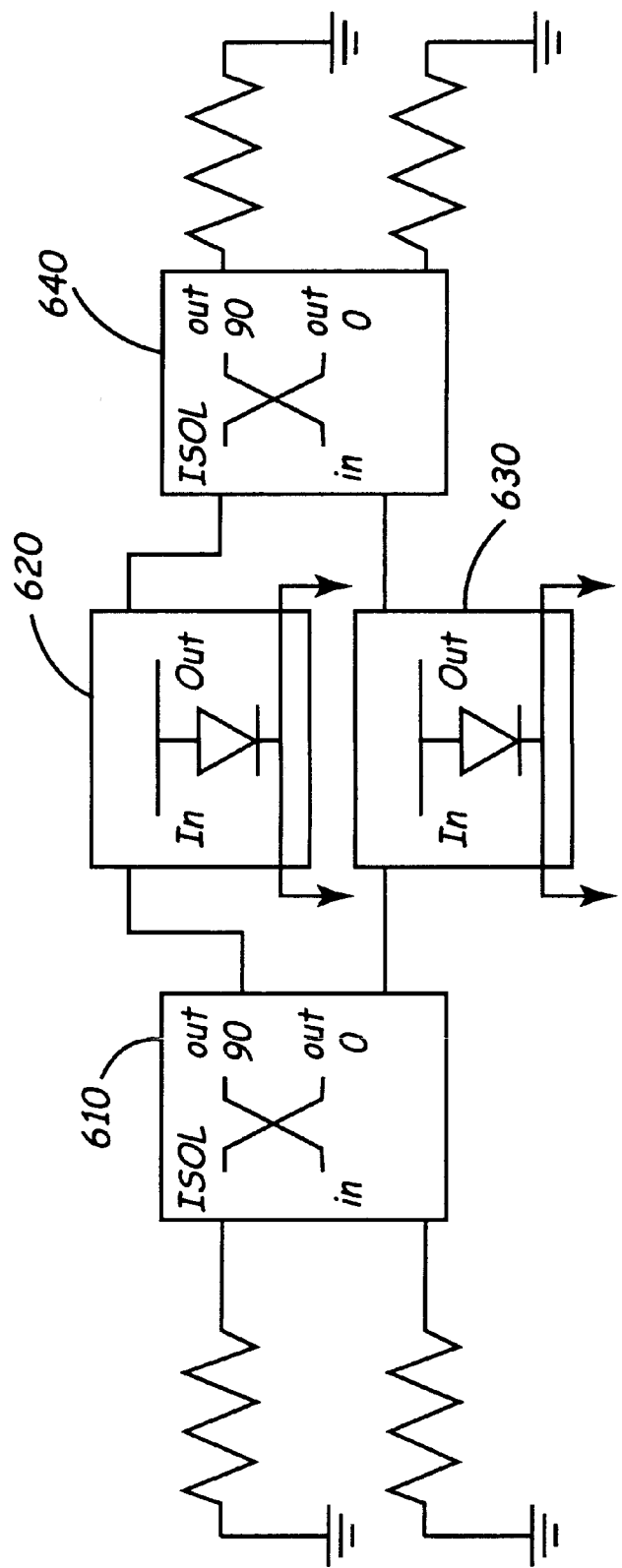
FIG. 6 is a block diagram of a hybrid coupler directional switch as used in the present invention.

The hybrid 200 can also be used as a combiner 640 and well as a splitter 610 as shown in FIG. 6. These properties as well as the reflective properties are combined to create a directional-switching configuration as shown in FIG. 6. Two PIN diode switches 620 and 630 are inserted between the splitter hybrid 610 and the combiner hybrid 640. The PIN diode switches 620 and 630 are either a short to ground when ON or an open to ground when OFF. The switches can then either reflect a signal or let it pass unimpeded.

Figure 7:
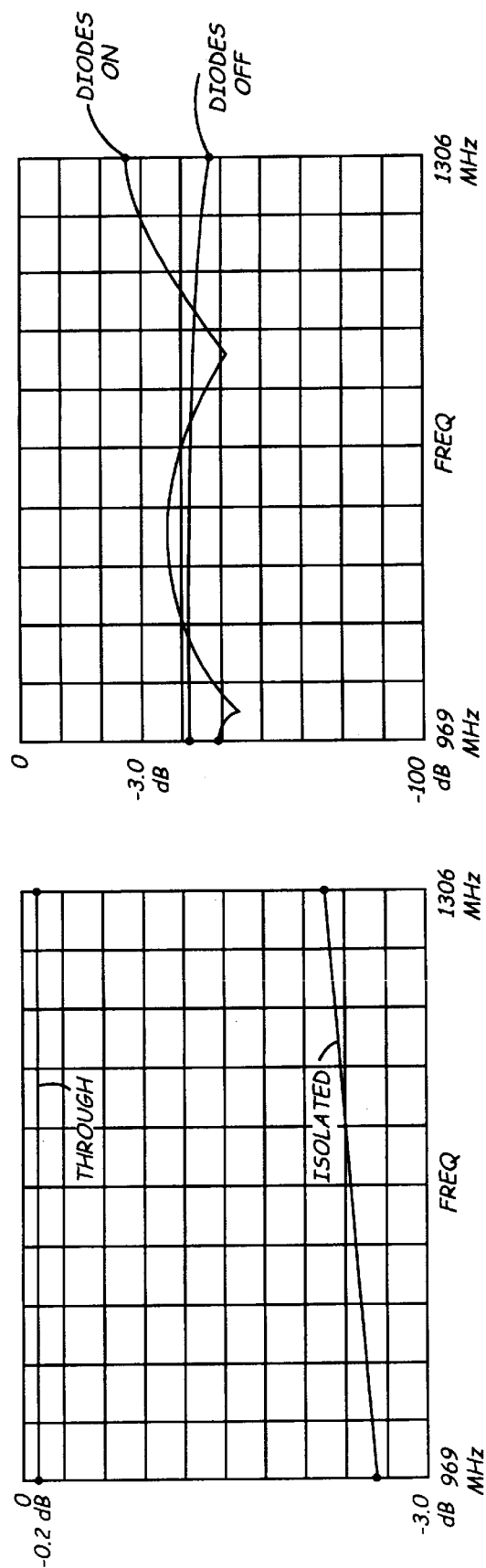
FIG. 7 is two graphs showing operation of the directional switch of FIG. 6.

In FIG. 6 with the PIN diodes switches 620 and 630 OFF, an input signal into the IN port of splitter hybrid 610 is split and input to the second or combiner hybrid 640. The phasing of the signal from the splitter 610 causes it to combine in the IN port of the combiner hybrid 640 and cancel in the ISOLATED port. The total effect is then to split and then recombine the signal and it passes through the switch with minimum loss. This is shown in FIG. 7 with the through trace, which shows about a 0.6-dB loss for real components (0 dB for ideal components).

If the PIN diode switches 620 and 630 of FIG. 6 are turned ON, they are effectively shorts to ground. In this case, the power input to the IN port of the splitter hybrid 610 is reflected to the ISOLATED port of the splitter hybrid 610 and ideally power is not transmitted to the combiner hybrid 640. This effectively reroutes power from one port to another under control of the switches 620 and 630. With non-ideal components, a small amount of power will leak through as shown in the isolated plot of FIG. 7 but this power is substantially suppressed. Another characteristic that is important to the invention is the return loss or load impedance seen looking into the IN port of the splitter hybrid 610. It is important that the return loss or load impedance is not substantially disturbed in either state of the PIN diode switches 620 and 630. The right graph of FIG. 7 shows that with the PIN diode switches 620 and 630 either ON or OFF, the return loss is better than 30 dB for actual components and at this level no substantial reflected power exists. In the ideal case, this return loss would be infinite but 20 dB to 30 dB is sufficient for typical implementations.

Figure 8:
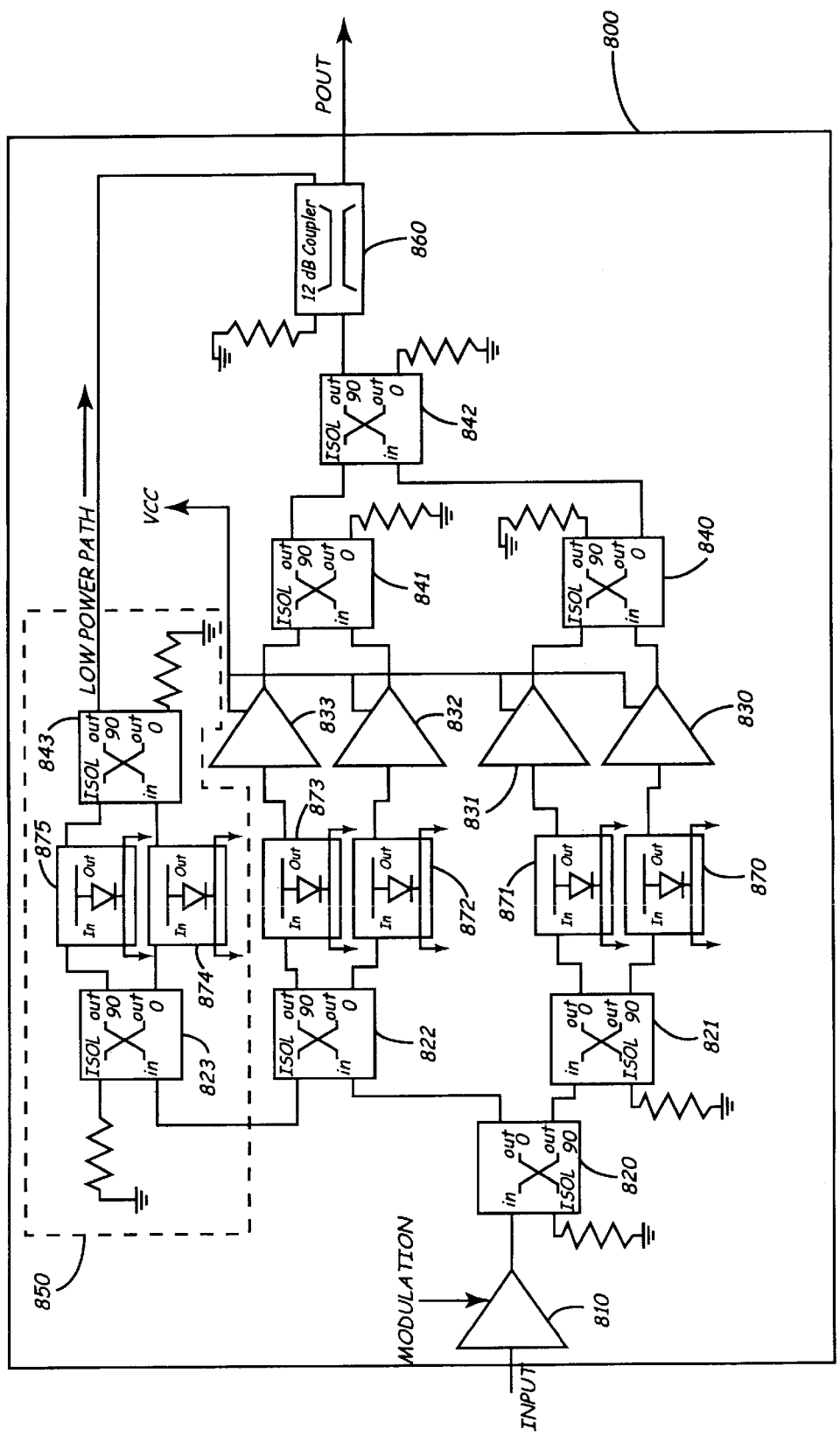
FIG. 8 is a block diagram of a multilevel power amplifier of the present invention employing four power amplifier stages.

An embodiment of the present invention is shown in FIG. 8 as a 1×4 or quad combining power amplifier with multilevel power modes. This embodiment the power amplifier 800 is comprised of a single input amplifier stage 810 driving four high power stages (830, 831, 832, and 833) in parallel to create the total combined output power. An input signal is amplified and may be modulated by the input amplifier 810. The input amplifier 810 drives a splitter network consisting of 3-dB hybrids. Hybrid 820 is an input splitter, hybrid 821 is a first splitter, and hybrid 822 is a second splitter in the splitter network. The behavior of all the 3-dB hybrids used in the quad power amplifier 800 is important to the operation of the invention as is explained above. The input splitter 820 splits the input signal received from the input amplifier 810. An IN port of splitter 820 is connected to output of the input amplifier 810 and an ISOLATION port connected to a termination resistor. The first splitter 821 has its IN port connected to a OUT_90 port of the input splitter 820 and provides splitter output signals. The first splitter 821 has an ISOLATION port connected to a termination resistor. The second splitter 822 has an IN port connected to an OUT_0 port of the input splitter 820 and provides splitter output signals. The second splitter 822 has an ISOLATION port connected to a bypass network.

As shown in FIG. 8, the splitter output signals from the four outputs of the hybrid splitter network (820, 821, and 822) are sent to PIN diode switches (870, 871, 872, and 873). A first switch 870 is connected to an OUT_90 port of the first splitter 821, a second switch 871 is connected to an OUT_0 port of the first splitter 821, a third switch 872 is connected to an OUT_0 port of the second splitter 822, and a fourth switch 873 is connected to an OUT_90 port of the second splitter 822. The PIN diode switches (870, 871, 872, and 873) have two states as previously discussed in conjunction with FIG. 6. When forward current is applied, the switches are a direct short to ground and reflect RF power back toward the source (ON condition). When a reverse voltage is applied (zero current) the switches are open and RF power is transmitted with no effect (OFF condition). The PIN diode switches (870, 871, 872, and 873) are used to select desired splitter output signals from the splitter network to set the output power level of the quad power amplifier 800 as will be discussed later.

The desired splitter output signals as selected by the switches are then sent to the inputs of the four power amplifier stages (830, 831, 832, and 833) for amplification. A first power amplifier stage 830 is connected to the first switch 870, a second power amplifier 831 is connected to the second switch 871, a third power amplifier stage is connected to the third switch 872, and a fourth power amplifier stage 833 is connected to the fourth switch 873. The power amplifier stages (830, 831, 832, and 833) may be any of a wide variety known in the art such as bipolar transistor and field effect transistor stages and may be single-ended or push-pull stages.

Amplified output signals from the power amplifier stages (830, 831, 832, and 833) are provided to a combiner network comprising hybrid combiners 840, 841, and 842 and a directional coupler 860. A first hybrid combiner 840 has an IN port connected to the output of the first power amplifier 830 and an ISOLATION port connected to the output of the second power amplifier 832. A second hybrid combiner 841 has an IN port connected to the output of the third power amplifier 832 and an ISOLATION port connected to the output of the fourth power amplifier 833. Combiners 840 and 841 combine the amplified output signals from the amplifier stages 830, 831, 832, and 833. The OUT_0 port of combiner 840 and the OUT_90 port of combiner 841 are connected to the IN port and the ISOLATION port of output combiner 842 respectively. The output combiner 842 further combines the amplified output signals. The OUT_90 port of combiner 840, the OUT_0 port of combiner 841 and the OUT_0 port of combiner 842 are all connected to termination resistors. The OUT_90 port of combiner 842 is connected to an input port of a directional coupler 860. The output port of directional coupler 860 forms the output of the quad power amplifier 800 as will be discussed later. A termination resistor is connected to a termination port of the coupler 860.

The ISOLATION port of the second hybrid splitter 822 is connected to an input of a low-power bypass path 850 instead of a resistive load, as is the case for splitters 820 and 821. The low-power bypass path 850 is a hybrid coupler directional switch as shown in FIG. 6. The ISOLATION port of the second hybrid splitter 822 is connected to an IN port of a third splitter 823 in the bypass path 850. The OUT_0 and OUT_90 ports of the third splitter 823 with the split bypass signals are connected to PIN diode switches 874 and 875 respectively. The outputs of the PIN diode switched 874 and 875 are connected to the ISOLATION port and the IN port of a third combiner 843. The OUT_90 port of combiner 843 is the output of the bypass path 850. The output of the bypass path 850 is connected to the coupled port of the directional coupler 860.

Figure 9:
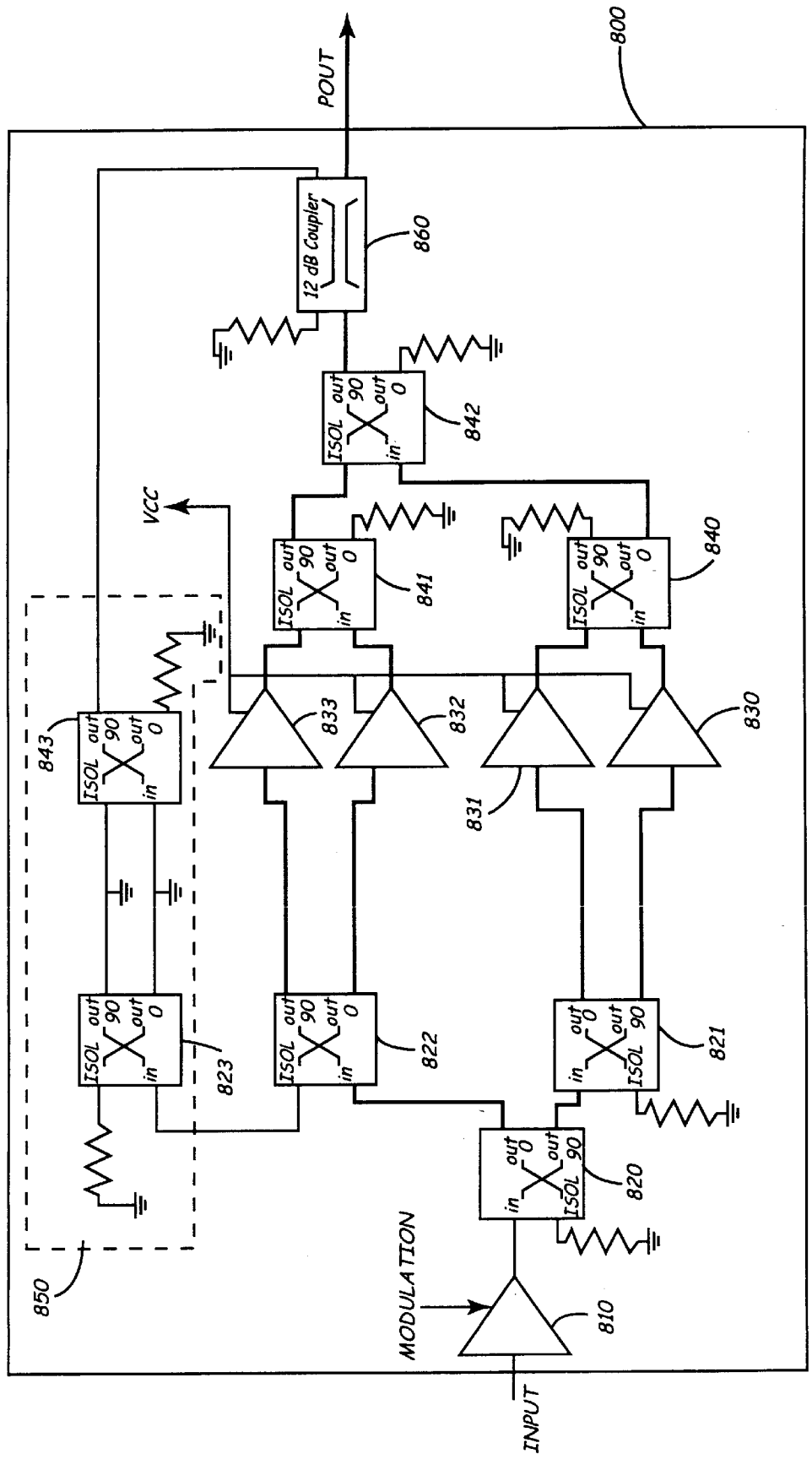
FIG. 9 is a block diagram of the multilevel power amplifier of FIG. 8 showing operation in a high power mode.

FIG. 9 shows high power level mode operation of the quad amplifier 800. In the high power mode, the four PIN diode switches 870, 871, 872, and 873 at the inputs of the power amplifiers 830, 832, 832, and 833 are in the OFF condition and are shown as direct through paths in FIG. 9. The two PIN diode switches 874 and 875 in the bypass path 850 are in the ON condition and are shown as direct shorts to ground in FIG. 9. The flow of RF power is shown with bold traces. The power flows from the single input amplifier 810 through the splitter network (820, 821, and 822), through the four power amplifiers (830, 832, 832, and 833) and then is recombined in the hybrid combiner network (840, 841, and 842) and sent to the output through the directional coupler 860. The bypass path 850 is isolated because the switches (874 and 875) in this path are in the ON state. If RF power flows into the bypass path 850 from the input of either the hybrid splitter 823 or combiner 843, the power will be reflected by the shorted switches 874 and 875. As explained previously, the reflected power will then flow into the resistors on the terminated ports of splitter 823 and combiner 843 and be dissipated there. In the high power mode the RF power never flows across the bypass path and the bypass path is thus isolated. The multilevel power amplifier of the present invention is configured as a conventional combining power amplifier in the high power mode.

Figure 10:
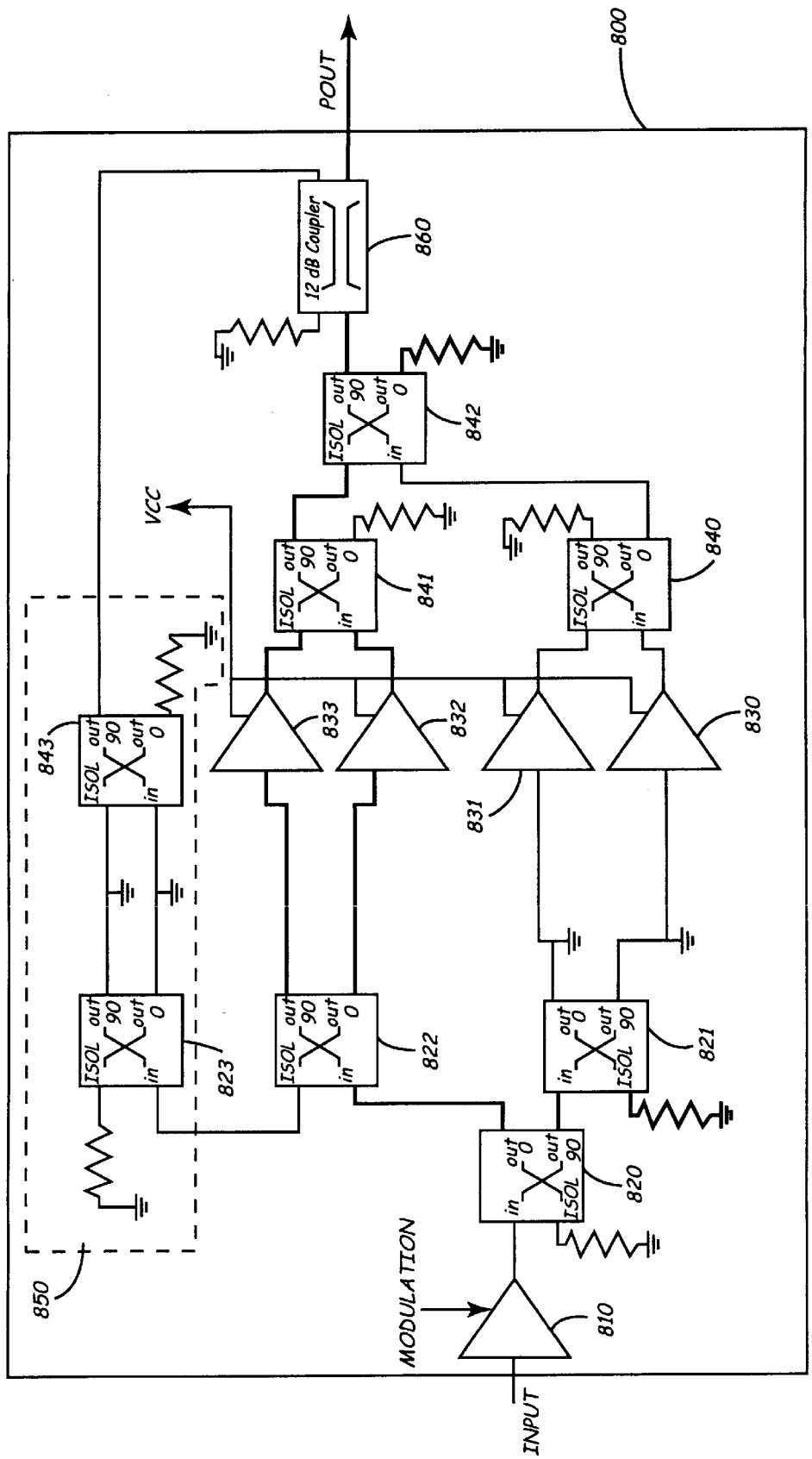
FIG. 10 is a block diagram of the multilevel power amplifier of FIG. 8 showing operation in a medium power mode.

To create the medium power mode a different combination of on and off PIN diode switches is needed in the quad power amplifier 800 of the present invention as shown in FIG. 10. In the medium power mode the difference from the high power mode is that two of the PIN diode switches 870 and 871 at the inputs to of a pair of the power amplifiers (830 and 831) are also turned ON. The ON PIN diode switches (870 and 871) are shown as shorts to ground in FIG. 10. The RF power flows from the single input amplifier 810 through the input splitter 820 and then to each of the splitters 821 and 822. The second splitter 822 passes the power to the inputs of the power amplifiers 832 and 833. The first splitter 821 sends the RF power to its power amplifiers 830 and 831, but the power encounters the shorted PIN diode switches 870 and 871 and the power is reflected back toward the first splitter 821. The phasing of the reflected signals causes the power to be sent to the termination resistor on the ISOLATED port of splitter 821 and the power is dissipated in the resistor. The power amplifiers 830 and 831 are therefore quiescent. The power output of the power amplifiers 832 and 833 is combined in the second hybrid combiner 841 and then sent to the output combiner 842. In the medium power mode, the output hybrid comber 842 acts differently than in the high power mode because of the lack of power coming from the power amplifiers 830 and 831. In the medium power mode, the power splits equally in combiner 842 between the termination on the OUT_0 port and the OUT_90 port output path as shown by the heavy lines. The result of the medium power configuration is that the output power is reduced by 6 dB from the high power mode.

An advantage of the approach of the present invention is that no bypass path is used in the medium power mode. This means no switch is used in the output path as in the prior art power amplifier 100 of FIG. 1. The switches that are used in the present invention are at a power level that is one-fourth that of a conventional bypass type power amplifier 100. In addition, the single modulated input amplifier stage 810 is unaware that the medium power configuration is active. The input amplifier 810 transmits the same power into the same load as in the high power mode and therefore its performance changes due to load changes are not an issue. The reflected power at the first splitter 821 is reflected into a termination and therefore the modulated stage input amplifier stage 810 does not see any difference in the reflected power.

Figure 11:
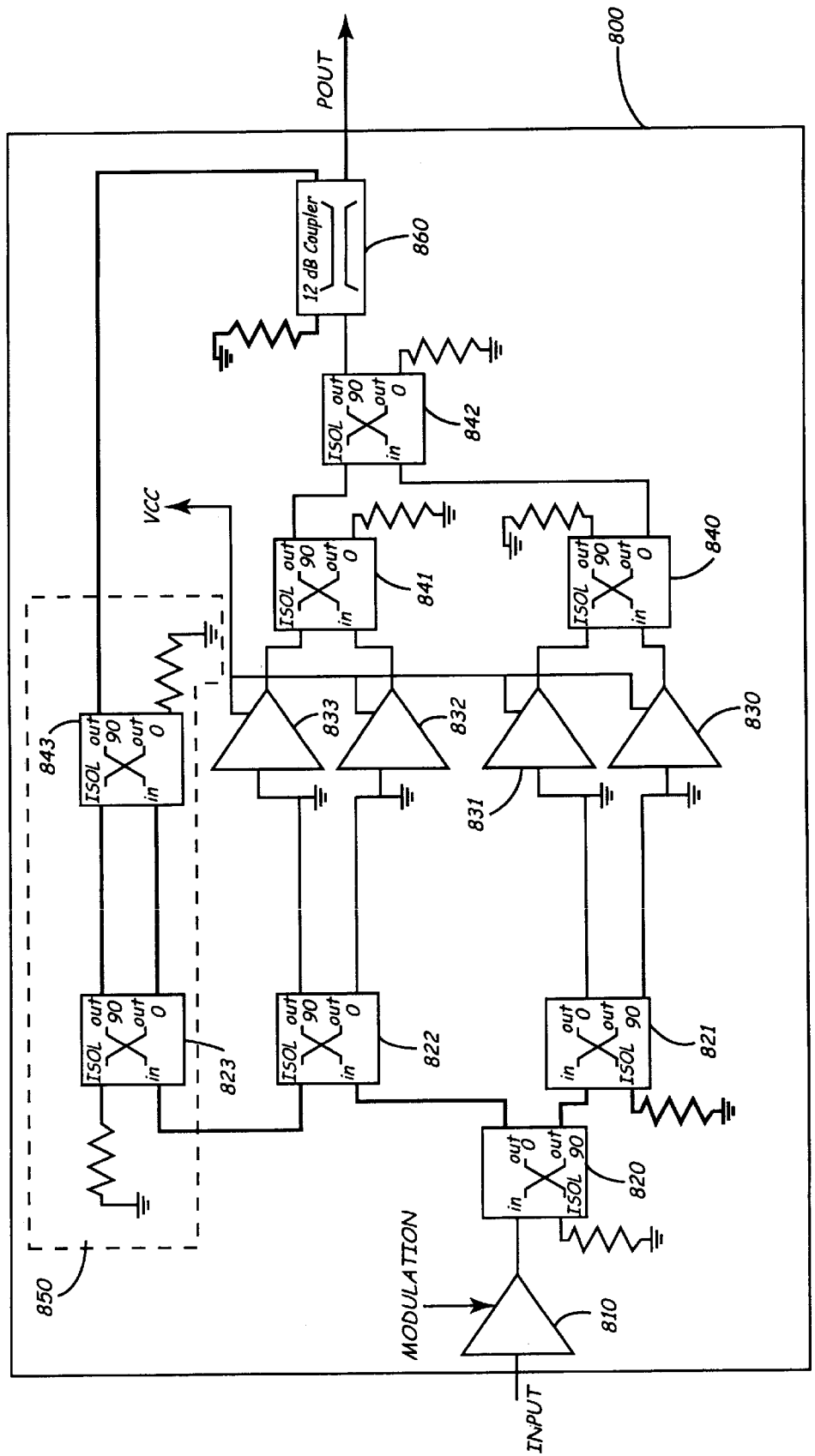
FIG. 11 is a block diagram of the multilevel power amplifier of FIG. 8 showing operation in a low power mode.

In the low power mode of the quad power amplifier 800 of the present invention, the bypass path 850 is utilized as shown in FIG. 11. In this mode, the two switches 874 and 875 in the bypass path 850 are OFF and all four switches 870, 871, 872, and 873 at the inputs of the power amplifiers 830, 831, 832, and 833 are ON or shorted to ground. The power from the single input amplifier modulated stage 810 is sent to the first hybrid splitter 820 and then on to the next pair 821 and 822 as before. Since the outputs of both of these hybrid splitters 821 and 822 are shorted, the power is reflected back to the ISOLATED ports on each. On the first splitter 821, the ISOLATED port has a termination resistor connected to it and the power is absorbed there. On the second splitter 822, the power is sent back to the ISOLATED port and then into the bypass path 850. In the bypass path 850 the power is split by the third splitter 823, passed through the OFF switches 874 and 875 and then combined in the third combiner 843 and sent to the output. To get to the transmit output, this power is coupled into the output path with the directional coupler 860. The directional coupler 860 sends a fraction of the power to the output and the rest to a load resistor connected to the termination port but the output connected to the power amplifiers 830, 831, 832, and 833 is isolated. The coupler 860 can be chosen to give the desired amount of output power in the low power mode. In the low power mode the modulated input amplifier 810 load is not changed since the power it transmits stays the same. The power reflected from the switches 870, 871, 872, and 873 is absorbed in a termination resistor connected to the ISOLATION port of splitter 821 or sent through the bypass path 850 to the output.

Figure 12:
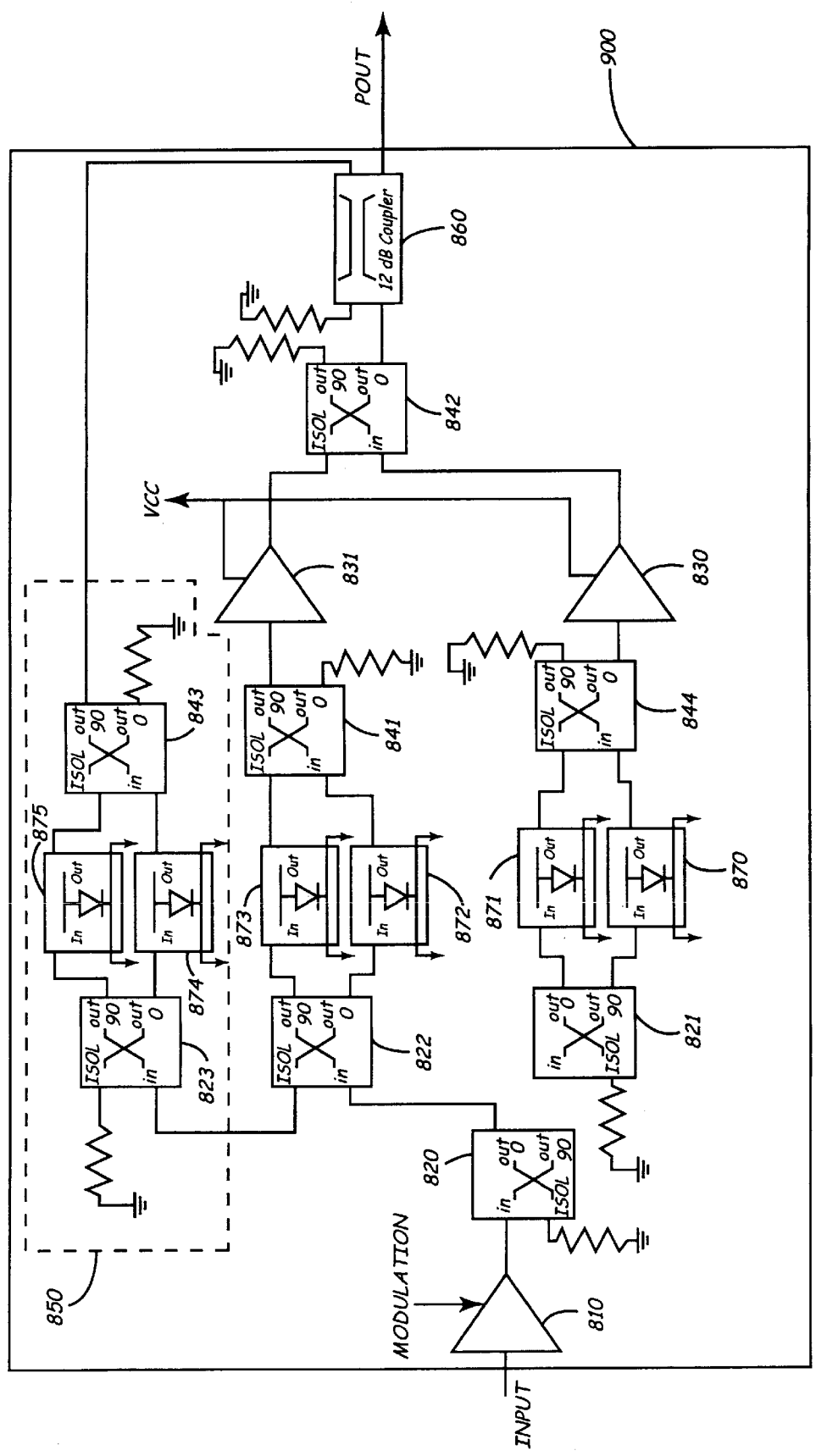
FIG. 12 is a block diagram of a multilevel power amplifier of the present invention employing two power amplifier stages.

Another embodiment of the present invention is shown in FIG. 12 as a 1×2 or dual combining power amplifier 900 with multi-level power modes. In this embodiment of the invention, two power amplifier stages 830 and 831 are combined to create the desire output power level. The approach for four power amplifier stages discussed above is modified to work with two power amp stages. The dual power amplifier 900 of FIG. 12 provides three power levels. In FIG. 12, a single modulated input amplifier 810 drives two output power amp stages 830 and 831 through a splitter and combiner network along with a bypass network 850 to create the desired output power level.

The dual combining power amplifier 900 relies on directional switches in the splitter network created by a pair of 3-dB hybrids and a pair PIN diodes switches as explained in conjunction with FIG. 6. One directional switch is located at the input of each power amplifier stage 830 and 831. In FIG. 12, the splitter network comprises the input splitter 820, the first splitter 821, and the second splitter 822 connected in the same fashion as the splitters (820, 821, and 822) in the splitter network of FIG. 8 to provide splitter output signals. Splitters 821 and 822 are the splitters for the two directional switches. The switches 870, 871, 872, and 873 are connected to the splitters 821 and 822 in the same fashion as the switches 870, 871, 872, and 873 shown in the embodiment of FIG. 8 to select desired splitter output signals.

To complete the directional switches at the inputs of the power amplifiers 830 and 831, a first power amplifier combiner 844 has its IN port connected to the first switch 870 and its ISOLATION port connected to the second switch 871. A second power amplifier combiner 845 has its IN port connected to the third switch 872 and its ISOLATION port connected to the fourth switch 873. The power amplifier combiners 844 and 845 combine the desired splitter output signals into combined signals for amplification. A first combined signal from the OUT_0 port of combiner 844 is sent to the first power amplifier stage 830. A second combined signal from the OUT_90 port of combiner 845 is sent to the second power amplifier stage 831. The OUT_90 port of combiner 844 and the OUT_0 port of combiner 845 are connected to termination resistors.

The combined signals as selected by the switches are amplified by power amplifier stages 830 and 831. The power amplifier stages (830, 831) may be any of a wide variety known in the art such as bipolar transistor and field effect transistor stages and may be single-ended or push-pull stages as with the embodiment of FIG. 8.

A directional switch is also located in the bypass path 850 of FIG. 12 as in the embodiment shown in FIG. 8. The interconnection and operation of the bypass paths 850 of both embodiments of the invention are the same.

The outputs of the two power amplifier stages 830 and 831 are combined in the combiner network comprising an output combiner 842 and a directional coupler 860. The first power amplifier 830 output is connected to the IN port of output combiner 842. The second power amplifier 831 output is connected to the ISOLATION port of output combiner 842. The other interconnections of the output combiner 842 and the coupler 860 of the combiner network of FIG. 12 are the same as that of the embodiment shown in FIG. 8.

Figure 13:
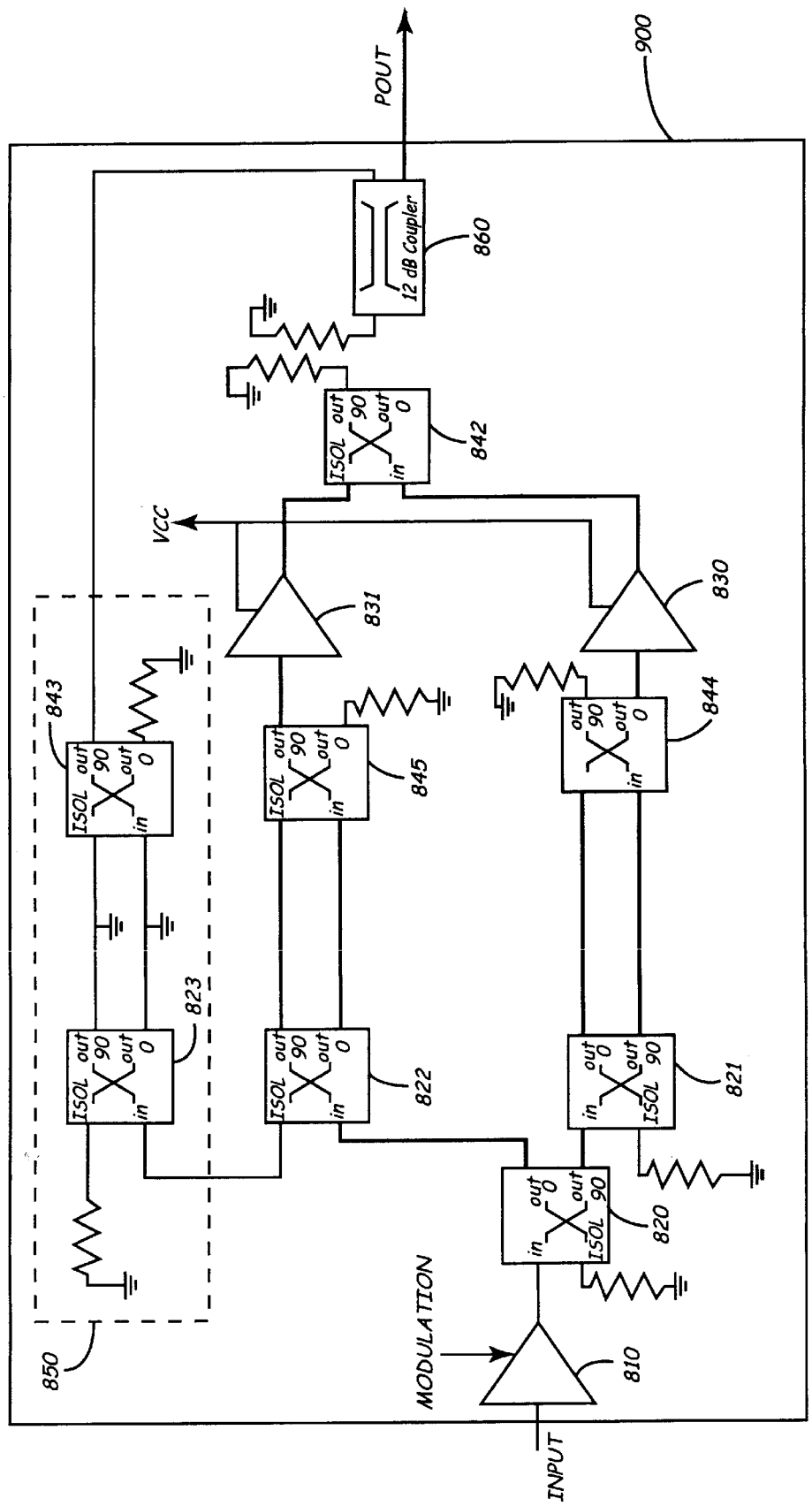
FIG. 13 is a block diagram of the multilevel power amplifier of FIG. 12 showing operation in a high power mode.

FIG. 13 shows the high power mode operation of the dual power amplifier 900 with the signal path in bold. The power from the modulated input amplifier stage 810 is split into two paths at input splitter 820 and then sent to the next pair of hybrid splitters (821 and 822) and again split into two equal paths. The diode switches (870, 871, 872, and 873) in these four paths are OFF and therefore the splitter signals travel through the switches into the power amplifier combiner hybrids (844 and 845) to combine the signals back into one. The power then continues on to the input of the power amplifier stages 830 and 831 to be amplified, and is combined in an output hybrid combiner 842 and sent to the output through the coupler 860. The bypass path 850 is isolated in the same way as the first embodiment and no signal flows in this path.

Figure 14:
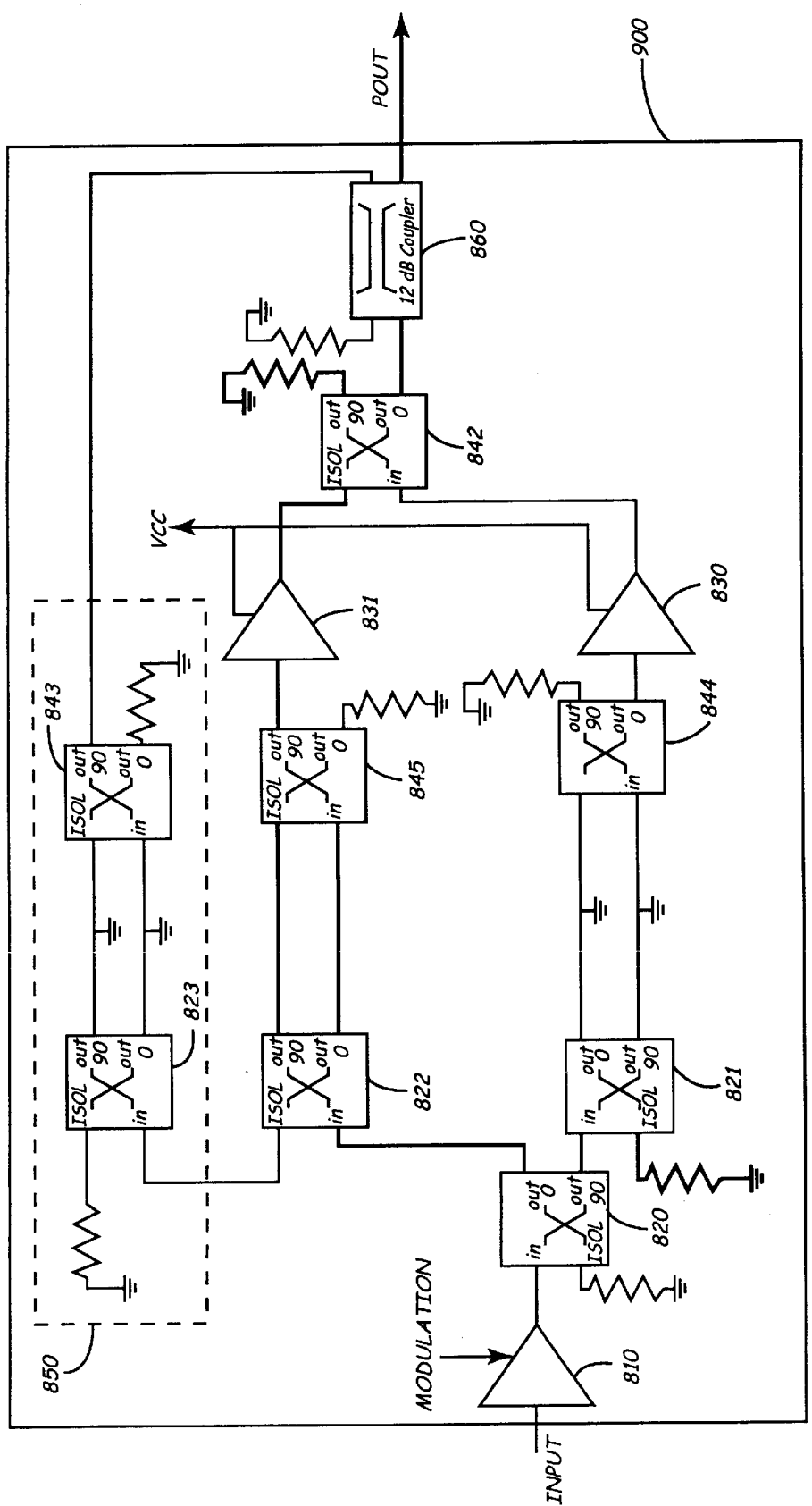
FIG. 14 is a block diagram of the multilevel power amplifier of FIG. 12 showing operation in a medium power mode.

FIG. 14 shows how the medium power mode is configured in the dual power amplifier 900. In the medium power mode, the diode switches 870 and 871 are turned ON and therefore shown as a short to ground. The power sent into diode switches 870 and 871 is reflected into the termination resistor on the ISOLATED port of first splitter hybrid 821 as shown with bold lines. Only one of the power amplifier stages 831 is energized and its output power is then split instead of combined in output combiner 842. Half of the power is then absorbed in the termination resistor on the OUT_90 port of the output combiner 842. The other half of the power is delivered to the coupler 860 and then out of the dual power amplifier 900. The reduction in output power is again 6 dB as in the first embodiment. The modulated input amplifier stage 810 is not affected by the change in the medium power mode since reflected power is sent into load termination resistors and not back into the output of the modulated input amplifier stage 810.

Figure 15:
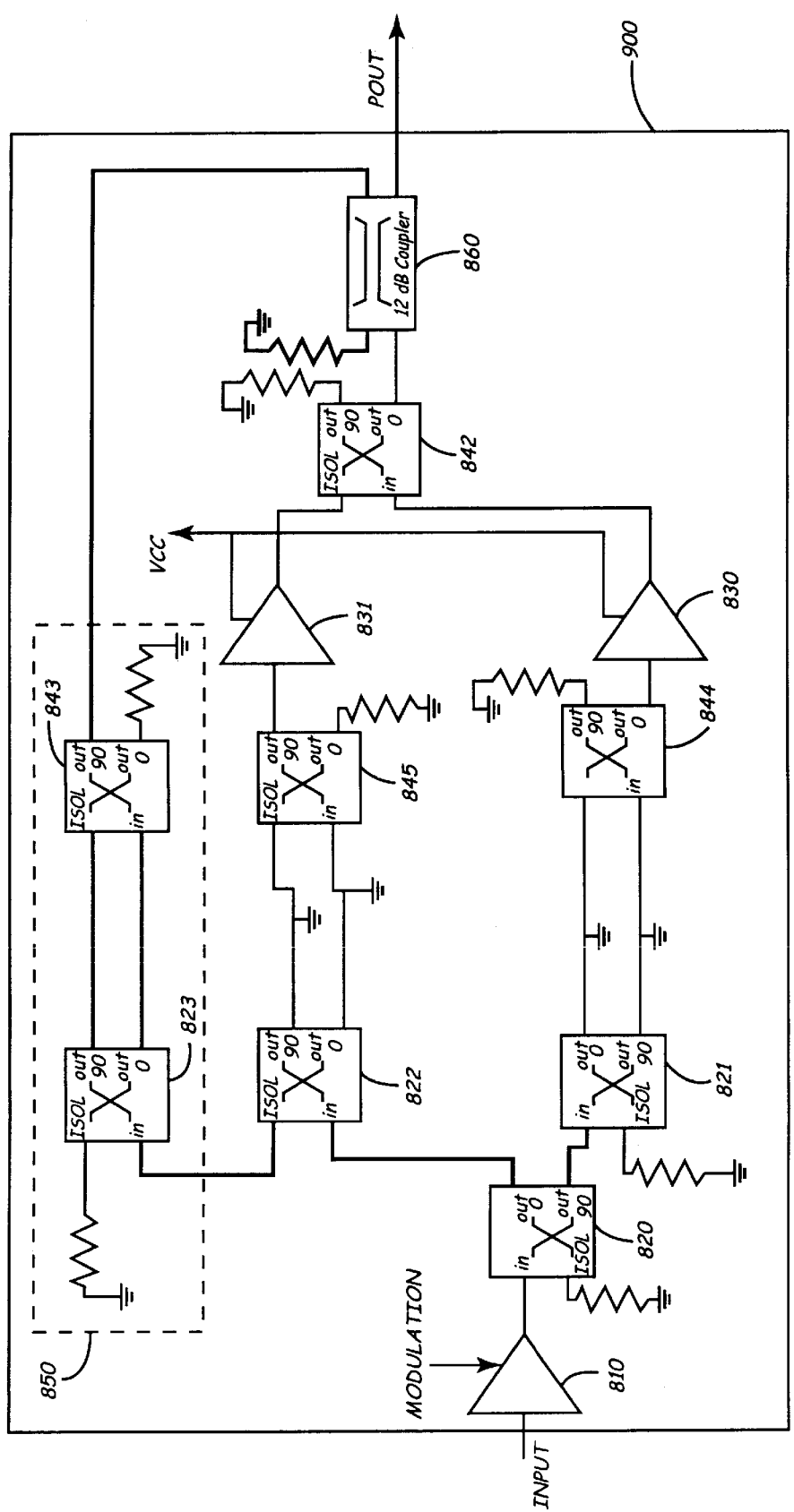
FIG. 15 is a block diagram of the multilevel power amplifier of FIG. 12 showing operation in a low power mode.

FIG. 15 illustrates the signal path for the low power mode of the dual power amplifier 900. All four diode switches 870, 871, 872, and 873 in the main path are ON and the two in the bypass path 850 switches 874 and 875 are OFF. The power from the modulated input amplifier stage 810 is reflected in the switches and half is dissipated in a termination resistor at the ISOLATION port of first splitter 821 shown in bold in FIG. 15. The other half of the power is reflected into the bypass path 850 third splitter 823. Since the diode switches 874 and 875 in the bypass path 850 are off, the signal continues on to be recombined in the third combiner 843 and then sent to the directional coupler 860 in the output path. This coupler 860 sends a fraction of the power (−12 dB in this example) to the coupler 860 output and the rest into a termination resistor at the termination port of the coupler 860 as shown in bold. Ideally, no power is sent back to the power amplifier stages 830 and 831 since the termination port of the coupler 860 is isolated.

It is believed that the multilevel power amplifier of the present invention and many of its attendant advantages will be understood by the foregoing description, and it will be apparent that various changes may be made in the form, construction and arrangement of the components thereof without departing from the scope and spirit of the invention or without sacrificing all of its material advantages, the form herein before described being merely an explanatory embodiment thereof. It is the intention of the following claims to encompass and include such changes.

What is claimed is:

1. A power amplifier with multiple power modes for providing a desired output level comprising:
   an input amplifier for amplifying an input signal;
   a splitter network connected to the input amplifier stage for splitting the amplified input signal into splitter output signals;
   a plurality of switches connected to the splitter network for selecting desired splitter output signals by presenting an open circuit to ground to pass the desired splitter output signal and a short circuit to ground to reflect a splitter signal back to the splitter network;
   a plurality of power amplifier stages connected to the plurality of switches for amplifying the desired splitter output signals into amplified output signals;
   a bypass network for bypassing the plurality of power amplifier stages with a bypass signal; and
   a combiner network connected to the plurality of power amplifier stages and to the bypass network for combining the amplified output signals and the bypass signal to obtain the desired output power level.

2. The power amplifier of claim 1 wherein the splitter network further comprises:
   an input splitter for splitting the input signal said input splitter having an input port connected to the input amplifier for receiving the amplified input signal and an isolation port connected to a termination;
   a first splitter for providing the splitter output signals said first splitter having an input port connected to a 90-degree output port of the input splitter and an isolation port connected to, a termination; and
   a second splitter for providing the splitter output signals said second splitter having an input port connected to a 0-degree output port of the input splitter and an isolation port connected to the bypass network.

3. The power amplifier of claim 2 wherein the splitters are 3-dB hybrid splitters.

4. The power amplifier of claim 2 wherein the plurality of switches further comprises:
   a first switch connected to a 90-degree output port of the first splitter for selecting the desired splitter output signals;
   a second switch connected to a 0-degree output port of the first splitter for selecting the desired splitter output signals;
   a third switch connected to a 0-degree output port of the second splitter for selecting the desired splitter output signals; and
   a fourth switch connected to a 90-degree output port of the second splitter for selecting the desired splitter output signals.

5. The power amplifier of claim 4 wherein the plurality of power amplifier stages further comprises;
   a first power amplifier stage connected to the first switch for amplifying the desired splitter output signals into the amplified output signals;
   a second power amplifier stage connected to the second switch for amplifying the desired splitter output signals into the amplified output signals;
   a third power amplifier stage connected to the third switch for amplifying the desired splitter output signals into the amplified output signals; and
   a fourth power amplifier stage connected to the fourth switch for amplifying the desired splitter output signals into the amplified output signals.

6. The power amplifier of claim 2 wherein the bypass network comprises a hybrid coupler directional switch said hybrid directional switch further comprising:
   a third splitter with an isolation port connected to a termination and an input port connected to an isolation port of the second splitter to receive and split the bypass signal;
   a first switch connected to a 0-degree output port of the third splitter for switching the split bypass signal;
   a second switch connected to a 90-degree output port of the third splitter for switching the split bypass signal;
   a third combiner with an input port connected to an output of the first switch for receiving the split bypass signal, an isolation port connected to an output of the second switch for receiving the split bypass signal, a 0-degree output connected to a termination, and a 90-degree output port for outputting the bypass signal.

7. The power amplifier of claim 6 wherein the combiner network further comprises:
   a first combiner with an input port connected to the first power amplifier stage, an isolation port connected to the second power amplifier stage, and a 90-degree output port connected to a termination said first combiner combining the amplified output signals;
   a second combiner with an input port connected to the third power amplifier stage, an isolation port connected to the fourth power amplifier stage, and a 0-degree output port connected to a termination said second combiner combining the amplified output signals;
   an output combiner with an input connected to a 0-degree output port of the first combiner, an isolation port connected to a 90-degree output port of the second combiner, and a 0-degree output port connected to a termination said output combiner further combining the amplified output signals; and
   a coupler with an input port connected to a 90-degree output port of the output combiner for receiving the combined amplified output signals, a coupled port connected to the 90-degree output port of the third combiner for receiving the bypass signal, and an output port for providing the desired power output level.

8. The power amplifier of claim 4 wherein the plurality of power amplifier stages further comprises:
   a first power amplifier combiner for combining the desired splitter output signals into a first combined signal said first power amplifier combiner having an input port connected to the first switch, an isolation port connected to the second switch, and a 90-degree output port connected to a termination;
   a second power amplifier combiner for combining the desired splitter output signals into a second combined signal said second power amplifier combiner having an input port connected to the third switch, an isolation port connected to the fourth switch, and a 0-degree port connected to a termination;

a first power amplifier stage for amplifying the first combined signal and connected to a 0-degree output port of the first power amplifier combiner; and a second power amplifier stage for amplifying the second combined signal and connected to a 90-degree output port of the second power amplifier combiner.

9. The power amplifier of claim 8 wherein the bypass network comprises a hybrid coupler directional switch said hybrid directional switch further comprising.

a third splitter with an isolation port connected to a termination and an input port connected to an isolation port of the second splitter to receive the bypass signal;

a first switch connected to a 0-degree output port of the third splitter for switching the split bypass signal;

a second switch connected to a 90-degree output port of the third splitter for switching the split bypass signal;

a third combiner with an input port connected to an output of the first switch for receiving the split bypass signal, an isolation port connected to an output of the second switch for receiving the split bypass signal, a 0-degree output connected to a termination, and a 90-degree output port for outputting the bypass signal.

10. The power amplifier of claim 9 wherein the combiner network further comprises:

an output combiner with an input connected to the first power amplifier stage, an isolation port connected to the second power amplifier stage, and a 90-degree output port connected to a termination said output combiner combining the amplified output signals; and a coupler with an input port connected to a 0-degree port of the output combiner for receiving the combined amplified output signals, a coupled port connected to a 90-degree output port of the third combiner for receiv-
ing the bypass signal, and an output port providing the desired power output level.

11. A combining power amplifier with multiple power modes comprising:

an input power amplifier for receiving and amplifying an input signal;

a input splitter connected to the input amplifier for splitting the amplified input signal;

a first splitter connected to the input splitter for receiving the split amplified input signal and providing splitter output signals;

a second splitter connected to the input splitter for receiving the split amplified input signal and providing splitter output signals;

a plurality of PIN diode switches connected to the outputs of the first and second splitters for selecting desired splitter output signals;

a plurality of power amplifier stages connected to the plurality of PIN diode switches for amplifying the desired splitter output signals into amplified output signals;

an output combiner connected to the outputs of the power amplifier stages for combining the amplified output signals;

a third splitter connected to an isolation port of the second splitter for receiving and splitting a bypass signal;

a pair of switches connected to the outputs of the third splitter for switching the split bypass signals;

a third combiner connected to the outputs of the pair of switches for combining the split bypass signals; and a coupler connected to the output combiner for receiving the amplified output signal and the third combiner for receiving the bypass signal to provide a desired output power level signal.

* * * * *